(12) United States Patent
Rothenbuhler

(10) Patent No.: US 10,436,614 B2
(45) Date of Patent: Oct. 8, 2019

(54) ROTATING MIRROR FACET IDENTIFICATION

(71) Applicant: Hewlett-Packard Development Company, L.P., Houston, TX (US)

(72) Inventor: Dan Rothenbuhler, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/761,951

(22) PCT Filed: Jan. 28, 2016

(86) PCT No.: PCT/US2016/015468
§ 371 (c)(1),
(2) Date: Mar. 21, 2018

(87) PCT Pub. No.: WO2017/131718
PCT Pub. Date: Aug. 3, 2017

(65) Prior Publication Data
US 2018/0274955 A1 Sep. 27, 2018

(51) Int. Cl.
*G01D 5/56* (2006.01)
*G01J 1/02* (2006.01)
*G02B 26/12* (2006.01)
*G01B 11/26* (2006.01)
*G01R 29/00* (2006.01)

(52) U.S. Cl.
CPC ............. *G01D 5/56* (2013.01); *G01B 11/26* (2013.01); *G01J 1/02* (2013.01); *G01R 29/00* (2013.01); *G02B 26/121* (2013.01); *G02B 26/127* (2013.01)

(58) Field of Classification Search
None
See application file for complete search history.

(56) References Cited

U.S. PATENT DOCUMENTS

| 5,546,188 | A | 8/1996 | Wangler et al. |
| 7,274,498 | B2 | 9/2007 | Vam Amstel |
| 7,483,196 | B2 | 1/2009 | Allen et al. |
| 8,035,675 | B2 | 10/2011 | Breen et al. |
| 8,371,507 | B2 | 2/2013 | Haggerty et al. |
| 8,610,754 | B2 * | 12/2013 | Nakazawa ........... G02B 26/127 347/243 |
| 9,052,513 | B2 * | 6/2015 | Chen ................ G03G 15/04072 |

(Continued)

FOREIGN PATENT DOCUMENTS

EP 0877337 11/1998

OTHER PUBLICATIONS

Yun, et al. Pulsed-source and Swept-source Spectral-domain Optical Coherence Tomography with Reduced Motion Artifacts, OSA Publishing, vol. 12 Issue 23. 19 pages.

*Primary Examiner* — Shawn Decenzo
(74) *Attorney, Agent, or Firm* — HP Inc. Patent Department

(57) ABSTRACT

An example system includes a photo detector and a phase detector. The photo detector may detect a facet of a rotating mirror, the rotating mirror having at least two facets. The phase detector may detect a phase of a motor driving rotation of the rotating mirror. The example system may also include a processor to determine a phase relationship between the facet detected by the photo detector and the phase of the motor detected by the phase detector.

15 Claims, 4 Drawing Sheets

(56) References Cited

U.S. PATENT DOCUMENTS

| | | | | |
|---|---|---|---|---|
| 2003/0015654 A1* | 1/2003 | Hirst | ............... | H04N 1/053 |
| | | | | 250/236 |
| 2009/0095814 A1 | 4/2009 | Haggerty et al. | | |
| 2010/0045770 A1* | 2/2010 | Pepe | ............... | B41J 2/471 |
| | | | | 347/261 |
| 2013/0038672 A1* | 2/2013 | Ohmiya | ............... | B41J 2/471 |
| | | | | 347/246 |
| 2015/0062281 A1* | 3/2015 | Nishiyama | ............... | B41J 2/473 |
| | | | | 347/261 |
| 2015/0323880 A1* | 11/2015 | Kamei | ............... | H04N 1/113 |
| | | | | 399/167 |
| 2016/0018753 A1* | 1/2016 | Sugimoto | ............... | G03G 15/043 |
| | | | | 347/118 |
| 2018/0017784 A1* | 1/2018 | Kamei | ............... | G02B 26/123 |
| 2019/0033578 A1* | 1/2019 | Uezono | ............... | G02B 26/127 |

\* cited by examiner

ROTATING MIRROR FACET IDENTIFICATION

BACKGROUND

Various types of imaging devices include numerous optical components, such as lenses and mirrors. For example, scanners and printers may employ a rotating mirror with multiple facets. As the mirror rotates a light source (e.g., a laser) reflecting from a facet of the mirror scans a line of an image for scanning or printing. The process may repeat with each facet of the rotating mirror.

BRIEF DESCRIPTION OF THE DRAWINGS

For a more complete understanding of various examples, reference is now made to the following description taken in connection with the accompanying drawings in which.

DETAILED DESCRIPTION

Various examples described herein provide for identification of a facet in a rotating mirror with multiple facets. In various examples, the identification of the facet may be achieved without the need for additional components, such as additional sensors or identifying markings on one or more facets. As described below, various examples use the phase relationship between the location of the facets and the phases of a motor used to drive the rotation of the mirror.

As noted above, as the mirror rotates a laser beam reflecting from a facet of the mirror scans a line of an image for scanning or printing. In some cases, imperfections in one or more facets of the rotating mirror may result in corresponding defects in the printing or scanning. Such defects may be addressed with application of corrections corresponding to the appropriate facet. In this regard, identification of the facet can facilitate such corrections.

Figure 1:
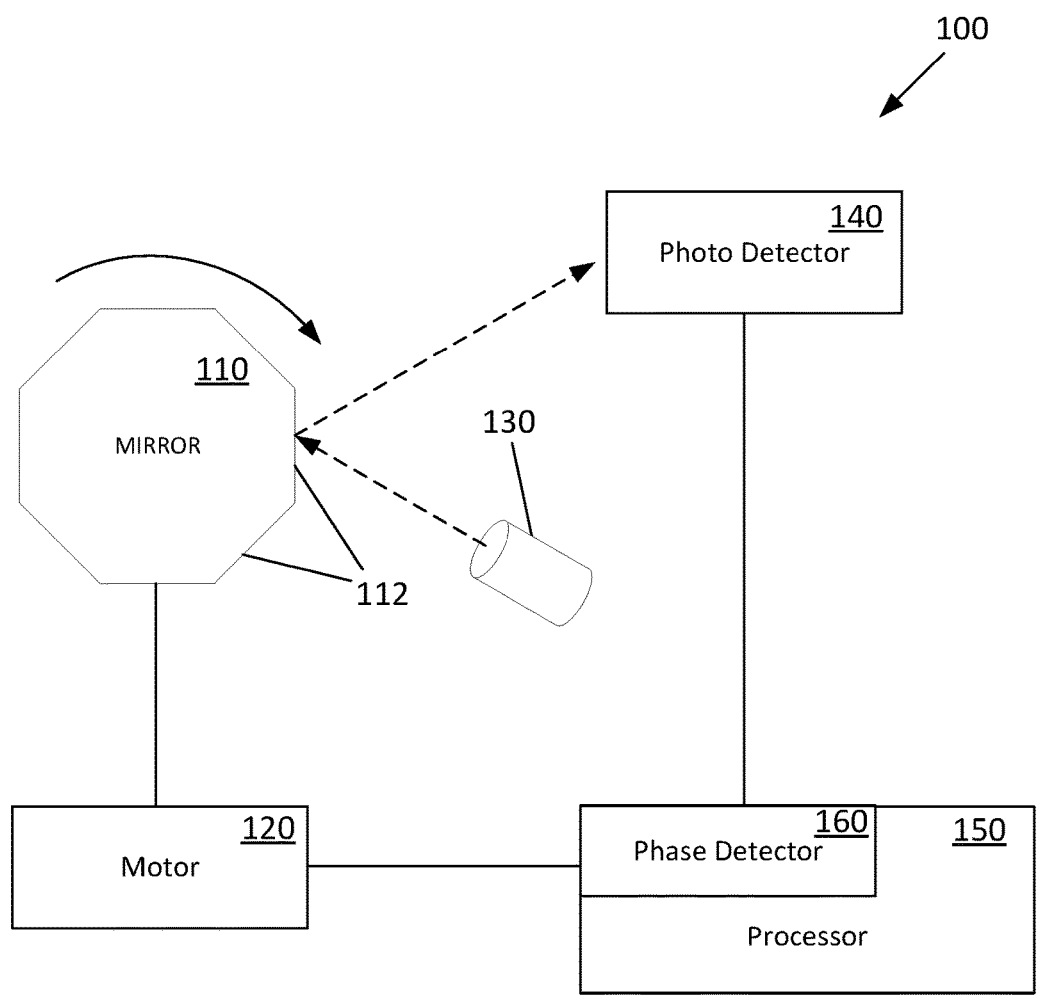
FIG. 1 illustrates an example system with a rotating mirror with multiple facets.

Referring now to the figures, FIG. 1 illustrates an example system with a rotating mirror with multiple facets. The example system 100 of FIG. 1 includes a mirror 110 rotating about a central axis in the direction indicated by the arrow. The rate of rotation of the mirror 110 may depend on various factors, such as the processing speed of the example system 100 for processing of an image, for example. Further, the size of the mirror may depend on various factors such as the size of the imaging system in which the example system 100 may be implemented.

The rotating mirror 110 of the example system 100 of FIG. 1 is illustrated with eight facets 112. In other examples, the rotating mirror 110 may have any of a variety of numbers of facets 112. As described below, in some examples, the rotating mirror may have 4, 8 or 10 facets.

The rotation of the mirror 110 is driven by a motor 120. The motor 120 may be an electrically driven, multi-phase motor. In one example, the motor is a three-phase motor with nine poles. Various parameters related to the motor may be selected for the particular use and design of the system 100. For example, the power (or load) of the motor may be determined by the size of the system 100 and the particular use of the system.

In the example system 100, a light source 130 is provided to direct a light onto the rotating mirror 110. The light source 130 may be any of a variety of types of light sources. In one example, the light source 130 is a laser that directs a laser beam to the mirror 110. As the mirror rotates, the laser beam is reflected by one facet 112 of the rotating mirror. The reflected beam scans a line, for example, as the mirror 110 rotates.

In addition to, or as a part of, scanning by the reflected laser beam, the reflected laser beam and the facet 112 reflecting the laser beam may be detected by a photo detector 140. The photo detector 140 may be provided to detect an intensity or the existence of the laser beam, for example. Detection of the reflected laser beam by the photo detector 140 may be used by the photo detector 140 to detect the facet 112 and the position of the facet 112.

The example system 100 is provided with a processor 150 communicatively coupled to the photo detector 140 and the motor 120. The processor 150 may receive a signal, such as an electronic pulse, when the photo detector detects a facet 112 by detecting the light reflected from the facet 112. Thus, for each full rotation of the mirror 110, the processor may receive pulses that equal in number to the number of facets 112 on the mirror 110.

The processor 150 also receives signals, or pulses, from the motor 120 that are associated with the phases of the motor. The phase signals may be generated by a motor driver (not shown) associated with the motor 120 or a position detector which may be used to control the motor driver, for example. In one example, the phase signals from the motor 120 are indicative of the peak value of each phase of the motor 120. In the example system 100 illustrated in FIG. 1, the processor 150 includes a phase detector 160 for receiving or detecting the phase signals from the motor 120.

The mirror 110 may be mounted in a random manner relative to the phases of the motor 120. In accordance with examples described herein, the processor 150 may use the phase signals from the motor 120 and the signals from the photo detector 140 to determine a phase relationship between the phases of the motor 120 and the location of the facets 112 of the mirror 110. In this regard, the mirror 110 may have any number m of facets 112, and the motor 120 may have any number n of phases and any number p of poles that provide a phase relationship which allows distinction between different facets 112. In one example, m and n may be any integers as long as they are not the same integer. In another example, m and n may be any integers where m is not a multiple of n. In another example, the number of mirror facets m and the number of poles p divided by the number of phases n (p/n) do not share any factors greater than 1. In one particular example, the motor 120 is a three-phase motor (n=3) with nine poles (p=9), and the mirror 110 has 4, 8 or 10 facets 112 (m=4, 8 or 10).

Figure 2:
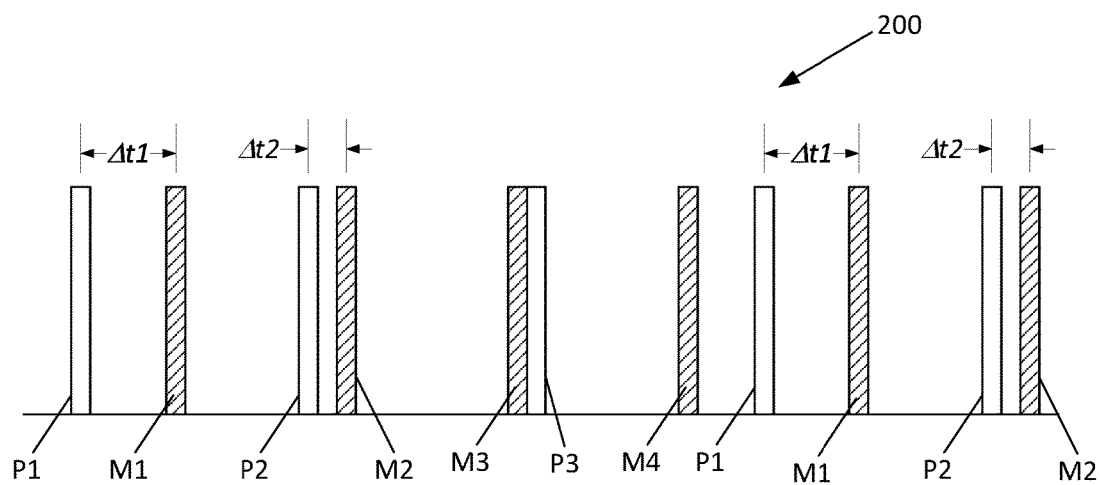
FIGS. 2 and 3 illustrate example phase relationships between mirror facets and phases of a motor.
Figure 3:
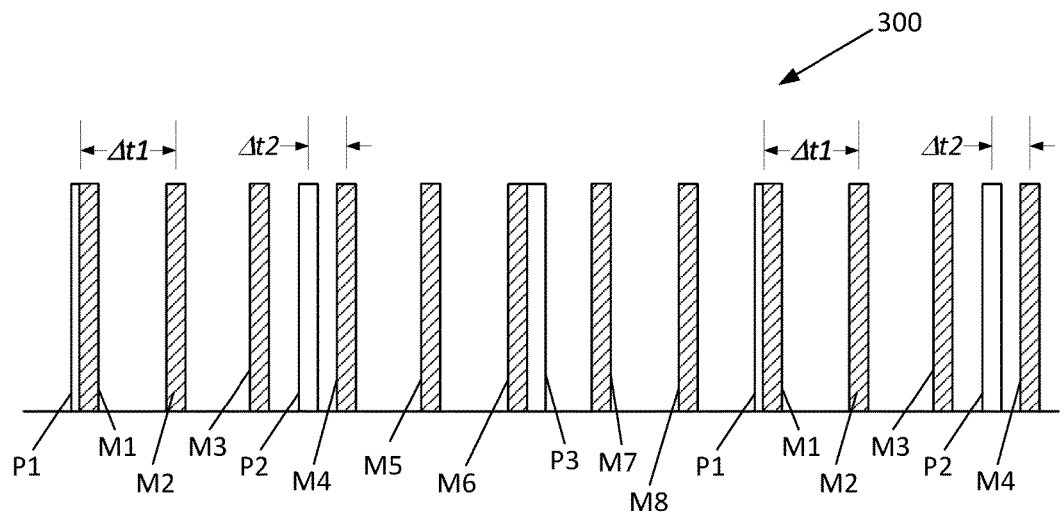

FIGS. 2 and 3 illustrate example phase relationships for two such examples. Referring first to FIG. 2, the phase relationship 200 is illustrated for a three-phase motor and a four-faceted mirror (m=4, n=3). The phase signals from the motor are indicated as P1, P2 and P3 corresponding to each phase of the three-phase motor. Further, the signals from the photo detector (referred to below as facet-detection signals) indicative of the facets of the mirror are indicated by M1, M2, M3 and M4. The phase signals occur at regular intervals corresponding to each 120-degree turn of the motor, and the facet-detection signals occur at regular intervals corresponding to each 90-degree turn of the mirror. As indicated in FIG. 2, the processor may determine a time difference between a motor phase signal and a face-detection signal. The time difference corresponds to a phase difference in the rotation of the mirror and the motor. Thus, the processor may determine a phase relationship between one or more phases of the motor (e.g., signal P1 or P2) and one or more facet-detection signals (e.g., signal M1 or M2). Because of the relationship between the number of mirror facets and the number of motor phases, the phase relationship may uniquely identify a particular facet of the mirror. For example, a facet-detection signal received Δt1 after a motor phase signal corresponds to facet M1. Similarly, a facet-detection signal received Δt2 after a motor phase signal corresponds to facet M2. As indicated in FIG. 2, the process repeats after each complete rotation of the mirror and the motor.

Referring now to FIG. 3, a phase relationship 300 is illustrated for a three-phase, nine-pole motor and an eight-faceted mirror (m=8, n=3). The phase signals from the motor are indicated as P1, P2 and P3 corresponding to each phase of the three-phase motor, facet-detection signals indicative of the facets of the mirror are indicated by M1-M8. Again, the phase signals occur at regular intervals corresponding to each 120-degree turn of the motor. For an eight-faceted mirror, the facet-detection signals occur at regular intervals corresponding to each 45-degree turn of the mirror. As indicated in FIG. 3, the processor may determine a time difference between a motor phase signal and a face-detection signal with the time difference corresponding to a phase difference in the rotation of the mirror and the motor. Thus, the processor may determine a phase relationship between one or more phases of the motor (e.g., signal P1 or P2) and one or more facet-detection signals (e.g., signal M1 or M2). In the example of FIG. 3, a facet-detection signal received Δt1 after a motor phase signal corresponds to facet M2. Similarly, a facet-detection signal received Δt2 after a motor phase signal corresponds to facet M4. The process repeats after each complete rotation of the mirror and the motor Referring now to FIG. 4, a flow chart illustrating an example process for identification of a facet of a rotating mirror is illustrated. The example process 400 may be implemented in, for example, the processor 150 shown in FIG. 1. The process includes detecting light reflected from a facet of a rotating mirror (block 410). As described above with reference to FIG. 1, light from a light source may be directed to the rotating mirror and reflected to a photo detector, for example. The detection of the reflected light results in detection of the facet reflecting the light.

Figure 4:
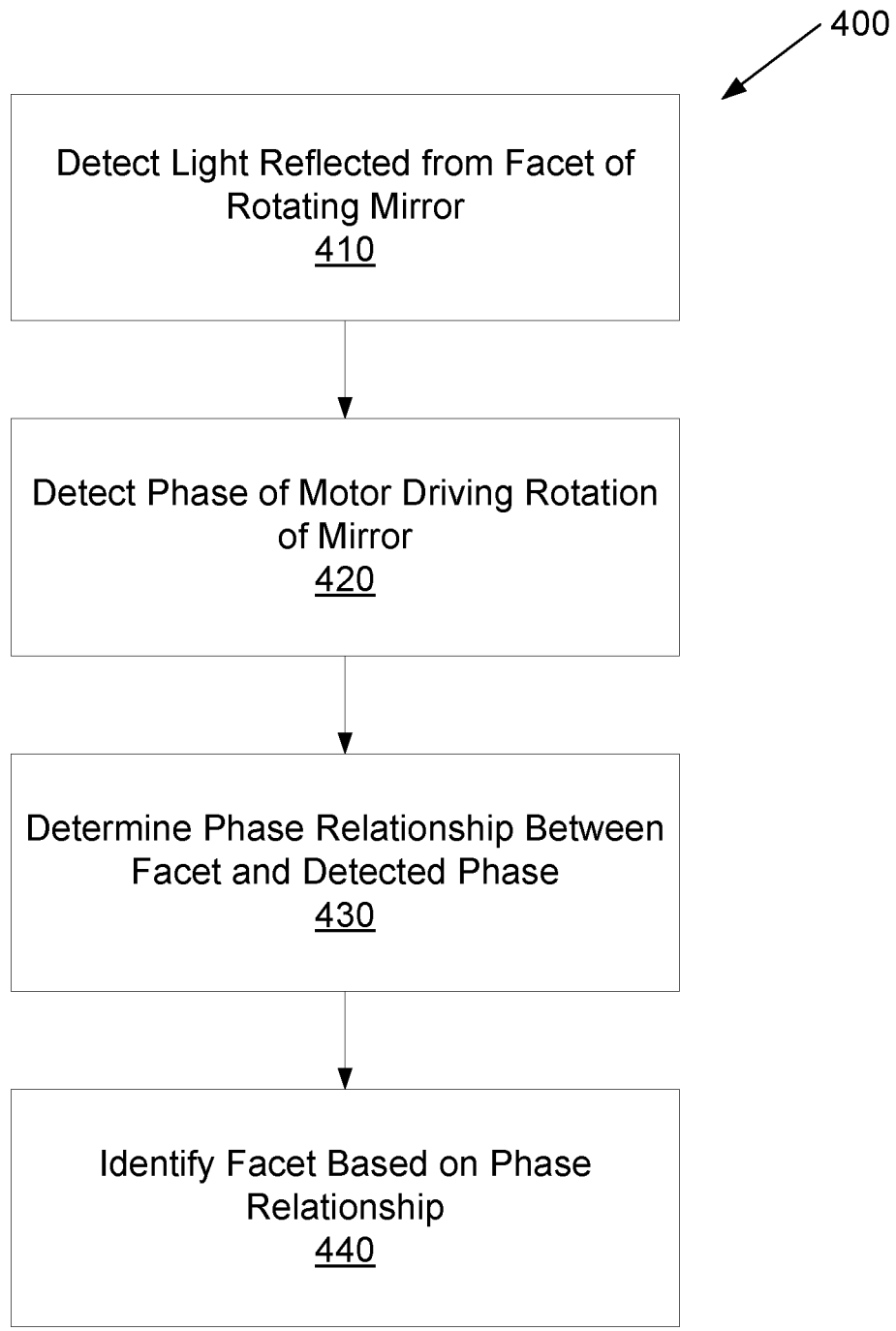
FIG. 4 is a flow chart illustrating an example process for identification of a facet of a rotating mirror.

Referring again to the example process 400 of FIG. 4, a phase of the motor driving the rotation of the mirror is detected (block 420). For example, the motor 120 illustrated in FIG. 1 may drive the rotation of the mirror 110. The motor may be, for example, a three-phase motor, the phases of which may be detected by a phase detector 160 of the processor 150. As described above with reference to FIGS. 2 and 3, the phase detection and the detection of the reflected light may be in the form of detecting signals, or pulses, generated as a result of the phase and light, respectively.

The detection of the motor phase (block 420) and the reflected light (block 410) may be used to determine a phase relationship between the motor phase and the facet reflecting the light (block 430). FIGS. 2 and 3 described above illustrate example phase relationships between the facets of the rotating mirror and the phases of the motor driving the rotation of the mirror.

The phase relationship may be used to identify the facet reflecting the light (block 440). As described above, the rotating mirror may have m facets, and the motor driving the rotation of the mirror may have n phases. The relationship between m and n may allow identification, or unique identification, of one or more facets of the rotating mirror.

In one example, a calibration of the phase relationship between the facets of the mirror and the phases of the motor may be performed at, for example, installation of the mirror. For example, the phase relationship between a four-faceted mirror and a three-phase motor, as shown in the example of FIG. 2, may be measured at installation of the mirror. The calibrated phase relationship may be stored in a system memory, for example, and may be accessed to identify specific facets of the mirror. For example, the identification of the facet (block 440) may include accessing the stored, calibrated phase relationship for comparison with the phase relationship determined (block 430) based on the detected reflected light (block 410) and the detected motor phase (block 420). Of course, in many systems, calibration of the phase relationship may not be required.

Figure 5:
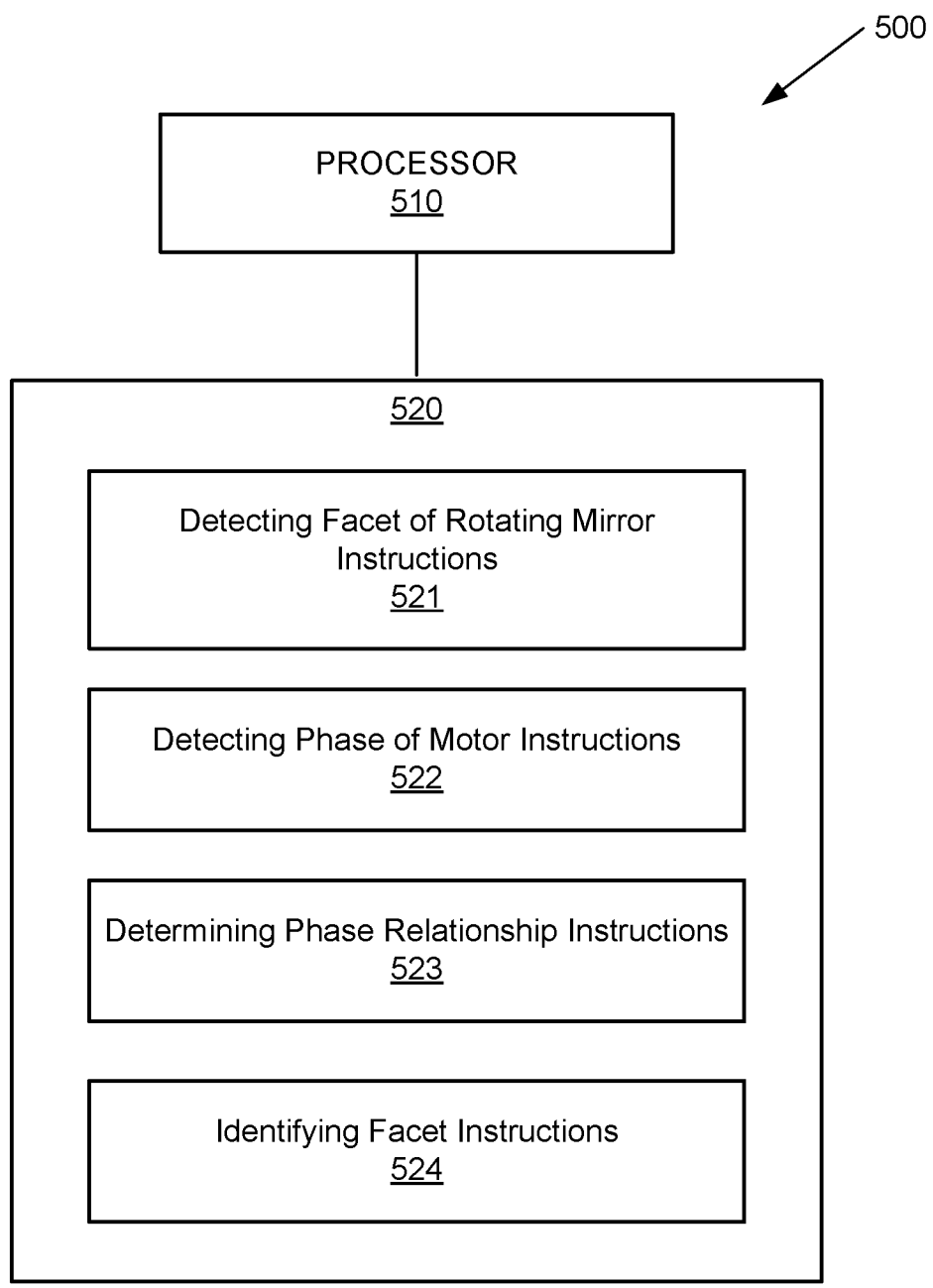
FIG. 5 illustrates a block diagram of an example system with a computer-readable storage medium including instructions executable by a processor for identification of a facet of a rotating mirror.

Referring now to FIG. 5, a block diagram of an example system is illustrated with a computer-readable storage medium including instructions executable by a processor for identification of a facet of a rotating mirror. The system 500 includes a processor 510 and a computer-readable storage medium 520. The computer-readable storage medium 520 includes example instructions 521-524 executable by the processor 510 to perform various functionalities described herein.

The example instructions include detecting facet of a rotating mirror instructions 521. The instructions 521 may cause the processor 510 to use detection of light reflected from a facet of a rotating mirror, the rotating mirror having at least two facets. Light reflected from the facet of a rotating mirror may be detected by, for example, a photo detector which generates a signal indicating detection of the facet.

The example instructions further include detecting the phase of a motor instructions 522. The instructions 522 cause the processor 510 to detect the phase of a motor driving the rotation of the rotating mirror. Each phase of a multi-phase motor may generate a signal, or pulse, that may be detected by a phase detector of the processor 510, for example.

The example instructions include determining phase relationship instructions 523. In this regard, the processor 510 uses the detected mirror facet and the motor phase to determine a phase relationship, as illustrated in the examples of FIGS. 2 and 3.

The instructions also include identifying facet instructions 524. In this regard, the processor 510 may use the phase relationship to identify the facet reflecting the light. As described above with reference to FIGS. 2 and 3, the phase relationship may uniquely identify the detected facet. In some examples, identification of the facet may include comparing the phase relationship determined by instructions 523 with a calibrated phase relationship, which may be stored in a memory.

Thus, in accordance with various examples described herein, identification of a facet in a rotating mirror with multiple facets may be identified. Identification of the facets may allow correction for imperfections in one or more facets of the rotating mirror.

Software implementations of various examples can be accomplished with standard programming techniques with rule-based logic and other logic to accomplish various database searching steps or processes, correlation steps or processes, comparison steps or processes and decision steps or processes.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable one skilled in the art to utilize the present disclosure in various examples and with various modifications as are suited to the particular use contemplated. The features of the examples described herein may be combined in all possible combinations of methods, apparatus, modules, systems, and computer program products.

It is also noted herein that while the above describes examples, these descriptions should not be viewed in a limiting sense. Rather, there are several variations and modifications which may be made without departing from the scope as defined in the appended claims.

What is claimed is:

1. A system, comprising:
   a photo detector to detect a plurality of facets of a rotating mirror and generate a plurality of facet-detection signals;
   a phase detector to detect a plurality of phases of a motor driving a rotation of the rotating mirror and generate a plurality of motor phase signals; and
   a processor to:
      receive the facet-detection signals from the photo detector and the motor phase signals from the phase detector,
      determine time differences between the motor phase signals and the facet-detection signals, wherein each of the time differences corresponds to a phase relationship between one of the phases of the motor detected by the phase detector and one of the facets of the rotating mirror detected by the photo detector, and
      identify a particular facet of the rotating mirror based on a total number of facets of the rotating mirror, a total number of phases of the motor, and the time differences between the motor phase signals and the facet-detection signals.

2. The system of claim 1, wherein each of the time differences is measured from a time one of the phases of the motor is detected to a time a next facet of the rotating mirror is detected.

3. The system of claim 1, wherein the photo detector is to detect the facets of the rotating mirror by detecting light reflected from the facets.

4. The system of claim 1, wherein the rotating mirror has m facets and the motor has n phases, where m is not a multiple n.

5. The system of claim 1, wherein the rotating mirror has m facets and the motor has n phases and p poles, where m and a ratio of p/n do not share any factors greater than 1.

6. The system of claim 5, wherein the n is 3, p is 9 and m is 4, 8, or 10.

7. A method, comprising:
   detecting, by a photo detector, a light reflected from each of a plurality of facets of a rotating mirror and generating a plurality of facet-detection signals;
   detecting, by a phase detector, a plurality of phases of a motor driving a rotation of the rotating mirror and generating a plurality of motor phase signals;
   determining, by a processor, time differences between the motor phase signals and the facet-detection signals, wherein each of the time differences corresponds to a phase relationship between one of the detected phases of the motor and one of the detected facets of the rotating mirror; and
   identifying, by the processor, a particular facet of the rotating mirror based on a total number of facets of the rotating mirror, a total number of phases of the motor, and the time differences between the motor phase signals and the facet-detection signals.

8. The method of claim 7, wherein the identifying the particular facet includes comparing the time differences to a calibrated phase relationship between the facets of the rotating mirror and the phases of the motor.

9. The method of claim 7, wherein the rotating mirror has m facets and the motor has n phases, where m is not a multiple n.

10. The system of claim 7, wherein the rotating mirror has m facets and the motor has n phases and p poles, where m and a ratio of p/n do not share any factors greater than 1.

11. The method of claim 10, wherein then is 3, p is 9 and m is 4, 8, or 10.

12. A non-transitory computer-readable storage medium encoded with instructions executable by a processor of a computing system to cause the processor to:
   detect a plurality of facets of a rotating mirror and generate a plurality of facet-detection signals;
   detect a plurality of phases of a motor driving a rotation of the rotating mirror and generate a plurality of motor phase signals;
   determine time differences between the motor phase signals and the facet-detection signals, wherein each of the time differences corresponds to a phase relationship between one of the detected phases of the motor and one of the detected facets of the rotating mirror; and
   identify a particular facet of the rotating mirror based on a total number of facets of the rotating mirror, a total number of phases of the motor, and the time differences between the motor phase signals and the facet-detection signals.

13. The non-transitory computer-readable storage medium of claim 12, wherein the instructions that are executable to cause the processor to detect the facets of the rotating mirror include instructions that are executable to cause the processor to detect light reflected from the facets.

14. The non-transitory computer-readable storage medium of claim 12, wherein the rotating mirror has m facets and the motor has n phases, where m is not a multiple n.

15. The non-transitory computer-readable storage medium of claim 14, wherein n is 3 and m is 4, 8, or 10.

* * * * *

UNITED STATES PATENT AND TRADEMARK OFFICE
CERTIFICATE OF CORRECTION

PATENT NO. : 10,436,614 B2
APPLICATION NO. : 15/761951
DATED : October 8, 2019
INVENTOR(S) : Dan Rothenbuhler Page 1 of 1

It is certified that error appears in the above-identified patent and that said Letters Patent is hereby corrected as shown below:

In the Claims

In Column 6, Line 27, in Claim 10, delete "system" and insert -- method --, therefor.

In Column 6, Line 30, in Claim 11, delete "then" and insert -- the n --, therefor.

Signed and Sealed this
Twenty-fourth Day of March, 2020

Andrei Iancu
*Director of the United States Patent and Trademark Office*